United States Patent [19]
Butler et al.

[11] 4,250,494
[45] Feb. 10, 1981

[54] CHARGE TRANSFER ANALOG-TO-DIGITAL CONVERTER WITH PRECISE CHARGE CONTROL

[75] Inventors: Walter J. Butler, Scotia; Charles W. Eichelberger, Schenectady, both of N.Y.

[73] Assignee: General Electric Company, Schenectady, N.Y.

[21] Appl. No.: 56,070

[22] Filed: Jul. 9, 1979

[51] Int. Cl.³ .............................................. H03K 13/09
[52] U.S. Cl. .......................... 340/347 CC; 307/221 D; 340/347 AD; 340/347 M; 340/347 NT; 357/24
[58] Field of Search ............ 340/347 M, 347 AD, 347 NT 347 CC;
357/24; 307/221 C, 221 D

[56] References Cited
U.S. PATENT DOCUMENTS

| | | | |
|---|---|---|---|
| 4,065,766 | 12/1977 | Butler et al. | 340/347 AD |
| 4,070,666 | 1/1978 | Butler et al. | 340/347 AD |
| 4,070,667 | 1/1978 | Eichelberger | 340/347 NT |
| 4,074,260 | 2/1978 | Butler et al. | 340/347 CC |
| 4,138,665 | 2/1979 | Eichelberger et al. | 340/347 NT |
| 4,138,666 | 2/1979 | Eichelberger et al. | 340/347 CC |

Primary Examiner—Thomas J. Sloyan
Attorney, Agent, or Firm—Geoffrey H. Krauss; Marvin Snyder; James C. Davis

[57] ABSTRACT

A charge transfer analog-to-digital converter is provided with means to establish the potential across a large storage well at a comparator threshold voltage at the initiation of a cycle. Charge transfer circuitry is also provided for transferring, into the large potential well, charge packets of size dependent only upon the value of a charge packet capacitance and a scaling voltage. Parasitic capacitance effects are essentially eliminated.

16 Claims, 11 Drawing Figures

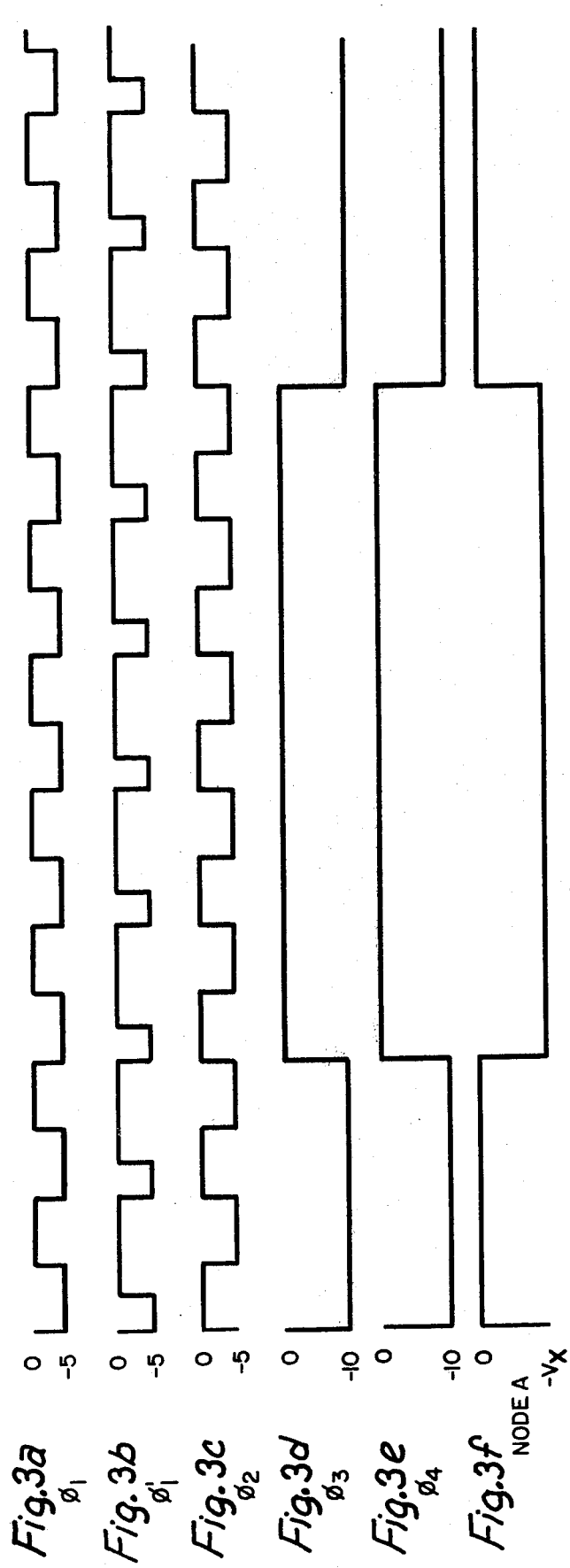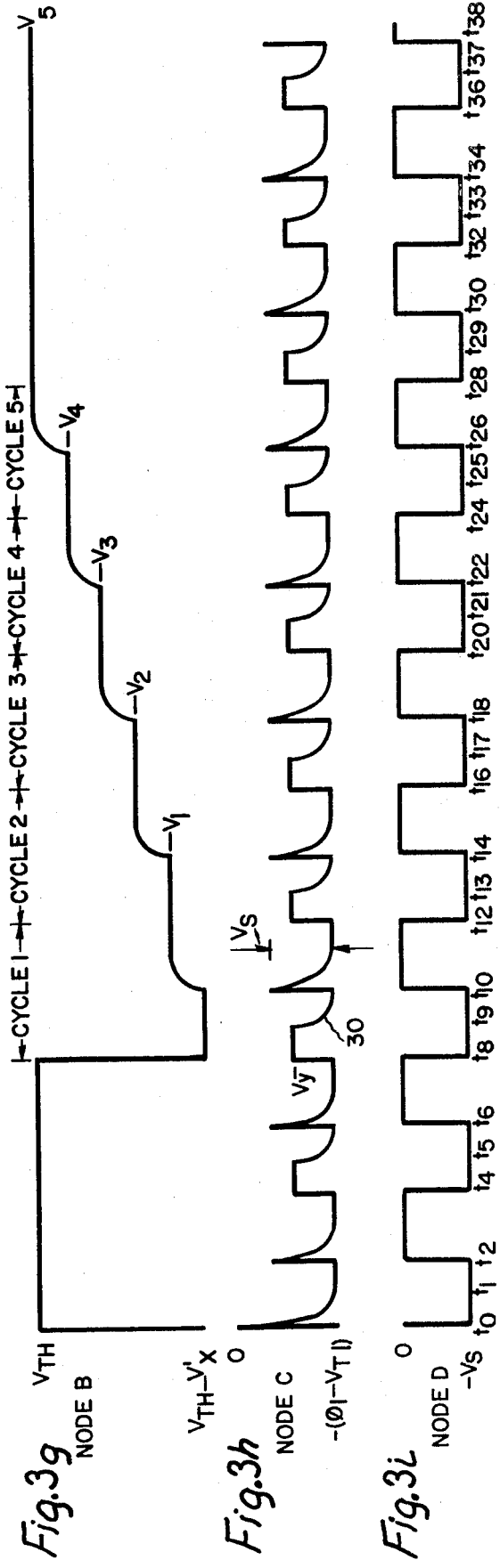

CHARGE TRANSFER ANALOG-TO-DIGITAL CONVERTER WITH PRECISE CHARGE CONTROL

BACKGROUND OF THE INVENTION

The present invention relates to analog-to-digital converters, and, more specifically, to charge transfer analog-to-digital converters having means for precisely controlling the size of packets of charge transferred in the conversion process.

Charge transfer analog-to-digital converters (ADCs), as described, for example, in U.S. Pat. Nos. 4,065,766; 4,070,666; 4,070,667; 4,074,260; and 4,138,665, all assigned to the same assignee as the present application and incorporated herein by reference, provide ADCs suitable for implementation in monolithic integrated circuit form. The ADCs described in the aforementioned U.S. Patents provide numerous advantages over the prior art; however, sources of error, in the form of parasitic capacitances formed between the substrate and various electrodes of the elements of the monolithically integrated ADCs, exist. It is therefore desirable to provide an improved charge transfer analog-to-digital converter wherein such errors are minimized and, preferably, essentially removed.

BRIEF SUMMARY OF THE INVENTION

In accordance with the invention, an analog-to-digital converter of the type having a large charge storage well, typically a first electrical capacitance, which receives an analog signal at one terminal thereof for conversion to a digital signal, and having means for comparing the voltage at the other terminal of the first capacitance to a threshold voltage, includes a charge packet generator means for transferring into the large storage well precisely metered packets of charge dependent in size only upon the value of the electrical capacitance of a second storage well and of an essentially constant scaling voltage source associated therewith.

In one preferred embodiment, integratable solid state switching means are utilized to not only establish the electrical potential across the large storage well, at the commencement of a measurement of an unknown input voltage but are also utilized for periodically switching one terminal of the charge-packet-forming capacitance between the scaling voltage and ground potential, while the remaining terminal of the charge-packet-forming capacitance is switched between a charging source and the large potential well. Advantageously, integratable solid state means formed across the charge-packet-forming capacitance acts to temporarily discharge that capacitance during initiation of each charge-packet-forming cycle to provide a plurality of successive charge packets of essentially constant magnitude.

Accordingly, it is an object of the present invention to provide an analog-to-digital converter of the charge transfer type which substantially eliminates the effects of parasitic capacitance components upon the accuracy of the conversion process.

This and other objects of the present invention will become apparent upon consideration of the following detailed description, when taken in conjunction with the drawings.

BRIEF DESCRIPTION OF THE DRAWINGS

FIGS. 3a–3i are a set of inter-related waveforms useful in understanding the operation of the converter of FIG. 2.

DETAILED DESCRIPTION OF THE INVENTION

Figures 1, 2:
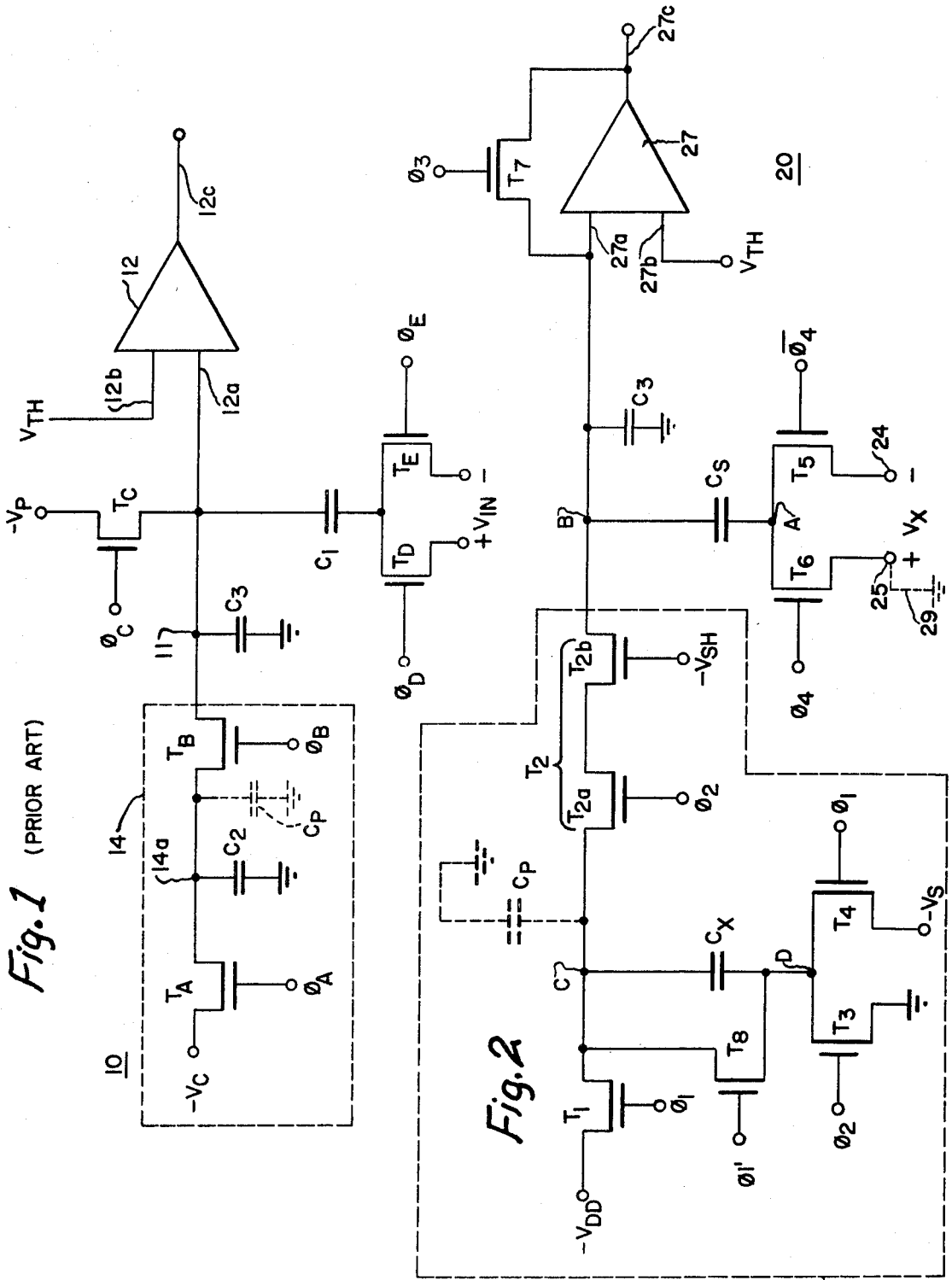
FIG. 1 is a schematic diagram of a prior art charge transfer analog-to-digital converter.
FIG. 2 is a schematic diagram of a precise charge control charge transfer analog-to-digital converter, in accordance with the principles of the present invention.

Referring initially to FIG. 1, one prior art analog-to-digital (A/D) converter 10 is of the form described and claimed in previously-mentioned U.S. Pat. No. 4,065,766. In this A/D converter, a node 11 is formed at one terminal of a first capacitor $C_1$, coupled to a first input 12a of a comparator 12 having its remaining terminal 12b coupled to a source of known threshold potential $V_{TH}$. Node 11 may be supplied with charge packets from a circuit 14 (shown in broken line) comprising first and second transistors $T_A$ and $T_B$, and a second capacitor $C_2$ at the junction therebetween. The source electrode of transistor $T_A$ is connected to a charging voltage $-V_C$ of known constant magnitude. A precharging transistor $T_C$ is connected between a source of precharge voltage of magnitude $-V_P$, and node 11. The remaining terminal of the first capacitance $C_1$ is coupled via switching transistors $T_D$ and $T_E$, respectively, to the unknown input voltage $V_{IN}$ to be measured. The transistors $T_A$–$T_E$ are advantageously of the MOSFET type, and have the respective gate electrodes thereof driven by waveforms $\phi_A$–$\phi_E$ respectively (provided by a waveform generator not shown for reasons of simplicity). A parasitic depletion capacitance $C_3$ exists between the electrodes of the various transistors coupled to node 11 and the substrate of the monolithic circuit in which converter 10 is formed. It should be understood that devices of the PMOS, NMOS and CMOS types may be utilized; PMOS transistors are assumed herein for purposes of illustration.

In operation, at the initiation of a measurement cycle, node 11 is preset from some arbitrary voltage level to the threshold voltage $V_{TH}$ of comparator 12 in a two-step process. Waveform $\phi_C$ selectively operates transistor $T_C$ to connect node 11 to precharge voltage $-V_P$ to decrease the voltage at node 11 below the threshold voltage of comparator 12. Transistor switch $T_C$ is then opened and charge packets are supplied to node 11 from capacitor $C_2$ by operation of transistors $T_A$ and $T_B$ in accordance with the alternating waveforms $\phi_A$ and $\phi_B$ at the gate electrodes thereof. During the initial operations, transistor switch $T_D$ is closed, connecting the lower terminal of capacitor $C_1$ to the lower of the two differential input signal voltages, e.g. $+V_{IN}$, by action of waveform $\phi_D$.

Signals $\phi_A$ and $\phi_B$ may be complimentary square-waves which alternately close transistor switches $T_A$ and $T_B$, whereby the ungrounded terminal of capacitor $C_2$ is first connected to charging voltage $-V_C$ to allow charge to flow through transistor $T_A$ into the capacitor until the voltage thereacross is equal to $-V_C$. Switch $T_B$ is then operated to cause the charge now contained in capacitor $C_2$ to flow into capacitor $C_1$ (and also into the parasitic depletion capacitance $C_3$.) When node 11 reaches the threshold voltage, the output 12c of comparator 12 changes level, causing switching transistor $T_D$ to open and switching transistor $T_E$ to close, connecting the remaining polarity, e.g. $-V_{IN}$, of the input voltage to the lower terminal of $C_1$. Charge packet supplying circuit 14 is operated, and the number of operations thereof counted, until the voltage at node 11, again reaches the threshold voltage of comparator 12, whereupon comparator output 12c again changes states signaling a complete conversion. As capacitor $C_2$ is smaller than, and has a substantially fixed ratio to, capacitor $C_1$, the magnitude of the unknown input voltage is related to the ratio of capacitors $C_1$ and $C_2$, as well as to the magnitude of charging voltage $-V_C$, whereby these three parameters may be predeterminately chosen such that the number of charge packets supplied by charging circuit 14 is related to the magnitude of the input voltage to be measured.

In this prior art A/D converter, charge transfers from the smaller capacitor $C_2$ to the larger capacitor $C_1$ occur in such manner that one terminal of small capacitor $C_2$ is always grounded while the other terminal of capacitor $C_2$ is connected to the transistors $T_A$ and $T_B$, which effect the charge transfer operation. As one terminal of capacitance $C_2$ is grounded, it is necessary to change the voltage at the ungrounded terminal of the capacitance, at node 14a. However, the connection of source and drain electrodes of charge transistors $T_A$ and $T_B$ at node 14a cause parasitic source and drain capacitances, represented by an equivalent parasitic capacitance $C_P$, to be present in parallel with small capacitor $C_2$. The magnitude of parasitic capacitance $C_P$ is increased by the gate-drain and gate-source capacitances of transistors $T_A$ and $T_B$, whereby even greater effects of parasitic capacitance to ground are present. Due to variations is processing parameters, the diffusion and overlap capacitances generating the total parasitic capacitance $C_p$ are not precisely controlled and will differ substantially. Hitherto, this change in total capacitance between node 14a and ground has been compensated for by adjusting the magnitude of charging voltage $-V_C$ to allow the total non-linear capacitance $(C_2+C_P)$ to generate charge packets yielding a desired reading when measuring a known reference. Alternative methods have been the additional use of a microcomputer to scale all readings according to a relationship found when measuring known voltages after initially presetting the magnitude of the charging voltage $V_C$, or adjustment of the control voltage by continuous feedback techniques to achieve a desired accuracy; this servo-scaling technique requires a system having increased complexity and requiring additional setup time for the circuit to acquire the scaling voltage, especially if scaling changes are made. With any of the previous techniques, the adjustment in circuit voltage requires not only a means for facilitating such adjustment (requiring an additional, adjustable component) but also requires a labor input to make the adjustment and is therefore undesirable in high volume, low cost applications for which a monolithic A/D converter would be desirable. A charge transfer circuit which is substantially independent of all process parameter variations, except the value of an MOS capacitance, is thus highly desirable. The scaled value of a measured voltage should be dependent only upon the value of a scaling voltage and the ratio between a pair of MOS capacitance (e.g. the first capacitance being a large storage well capacitance $C_1$ and the second capacitance being a small charge transfer capacitance $C_2$) in such manner that the charge supplied to the large storage well $C_1$ of the converter is independent of parasitic, overlap and diffusion capacitances associated with the charge transfer transistors $T_A$ and $T_B$. Further, it is desirable that the input voltage to be measured, can be scaled to a given scale value using a fixed scaling voltage, rather than some adjustable scaling voltage requiring additional circuitry, such as computing or servo-scaling components.

The desired improvements are realized in the analog-to-digital converter (ADC) 20 of FIG. 2. A large storage well is provided by a MOS capacitance $C_S$, having the first and second terminals thereof connected respectively to nodes A and B. A subcircuit 22, for providing metered charge packets to node B, includes a small depletion well capacitance $C_X$ having a pair of terminals coupled between nodes C and D. A first transistor $T_1$ is coupled between node C and a source of charging potential of essentially fixed magnitude $V_{DD}$. A transfer transistor $T_2$ is best represented by a pair of transistors, $T_{2a}$ and $T_{2b}$, connected with their source-drain circuits in series between nodes C and B. A first switching transistor $T_3$ has the drain-source circuit thereof connected between node D and electrical ground. Another switching transistor $T_4$ has the drain-source circuit thereof connected from node D to a source of scaling potential of magnitude $V_S$. A discharge transistor $T_8$ has a drain-source circuit connected across capacitor $C_x$.

The unknown input voltage $V_X$ to be measured is connected between first and second input terminals 24 and 25. An input switching transistor $T_5$ is connected from terminal 24, at which the more negative input voltage is to be connected, to node A, while another input switching transistor $T_6$ is connected from input terminal 25, receiving the more positive of the differential input voltage, to node A. A depletion capacitance $C_3$ appears between node B and ground. Node B is also connected to one input 27a of a comparator 27, having its remaining input 27b connected to a source of a threshold voltage of essentially constant magnitude $V_{TH}$. The drain-source circuit of a switching transistor $T_7$ is connected between the output 27c of the comparator and the first input 27a thereof.

For purposes of illustration, all of transistors $T_1$–$T_8$ are assumed to be of the PMOS type, whereby more negative voltages between gate and source electrodes tend to increase the current flow in the drain-source circuit of the device. It should be understood that NMOS and CMOS devices may be equally as well utilized. A control circuit, not shown for reasons of simplicity, provides the gate electrodes of transistors $T_1$ and $T_4$ with a first waveform $\phi_1$ (FIG. 3a). The $\phi_1$ waveform may be a squarewave alternating between levels of zero volts and a desired negative voltage, e.g. $-5$ volts. The gate electrode of transistor $T_8$ is provided with a waveform $\phi_1'$ (FIG. 3b) having a resting amplitude of zero volts and providing a short duration pulse to some negative voltage, e.g. $-5$ volts, commencing at each negative-going edge of the $\phi_1$ waveform and having a time duration less than the negative-excursion time-duration of the $\phi_1$ waveform. The gate electrodes of transistors $T_{2a}$ and $T_3$ are provided with a waveform $\phi_2$ (FIG. 3c) alternating between zero volts and a negative voltage, e.g. $-5$ volts, in manner such that the negative-going excursions of the $\phi_1$ and $\phi_2$ waveforms are mutually exclusive. Thus, the $\phi_2$ waveform may be the complement of the $\phi_1$ waveform, or the $\phi_1$ and $\phi_2$ waveforms may be nonoverlapping clock signals, with respect to negative-going excursions. The gate electrode of transistor $T_{2b}$ is held at an essentially constant negative shelf voltage $-V_{SH}$. In practice, the single device $T_2$ has the $\phi_2$ waveform coupled to the gate electrode thereof. Another waveform $\phi_3$ (FIG. 3d) is provided to the gate electrode of transistor $T_7$. Complimentary waveforms $\phi_4$ (FIG. 3e) and $\bar{\phi}_4$ are provided respectively to the gate electrodes of transistors $T_6$ and $T_5$.

Referring now to FIGS. 2 and 3a-3i, operation of ADC 20, in which charge packet circuit 22 meters charge into capacitance $C_S$ in precise steps, proceeds in the following manner: at initiation of a conversion cycle (time $t_o$ in FIGS. 3a-3i) input switching waveform $\phi_4$ (FIG. 3e) is at a negative value, e.g. minus 10 volts, whereby input switching transistor $T_6$ is saturated and connects input terminal 25 to node A. The complimentary waveform $\bar{\phi}_4$ is thus at zero volts, rendering input switching transistor $T_5$ in the cutoff condition and isolating input terminal 24 from node A. Simultaneously, switching voltage $\phi_3$ (FIG. 3d) is also at a negative voltage, e.g. minus 10 volts, whereby transistor $T_7$ is saturated, connecting the output 27c to the first input 27a of the comparator; the comparator output level is held at its transition, or firing, voltage and node B is at the threshold voltage $V_{TH}$ (FIG. 3g). The voltage at node A (FIG. 3f) is assumed, for purposes of illustration, to be held at zero potential, as by referencing of the more positive polarity of input signal $V_X$ to ground 29. Thus, with transistor $T_6$ turned on, node A is held at the more positive potential of the unknown voltage $V_X$ and will be so held until a measurement of the amplitude of input voltage $V_X$ is desired. In the interval between time $t_0$ and $t_8$ (at which latter time a measurement of the unknown input voltage $V_X$ is to be made) transistor $T_7$ remains in the saturated condition holding the node B voltage at the threshold voltage $V_{TH}$; the operation of charge-packet-supplying circuit 22 does not affect the magnitude of the voltage at node B during this time interval.

At a desired time (illustratively, $t_8$) an actual measurement of input voltage $V_X$ is commanded to commence. Waveform $\phi_3$ (FIG. 3d) returns to a zero voltage level, whereby transistor $T_7$ is cut off and disconnects the comparator output 27c from node B to unclamp node B from the threshold voltage. Simultaneously, the input switching waveforms $\phi_4$ and $\bar{\phi}_4$ reverse polarity, whereby waveform $\phi_4$ (FIG. 3e) returns to zero volts, rendering transistor $T_6$ in the cutoff condition, while the complimentary waveform $\bar{\phi}_4$ falls to the negative voltage ($-10$ volts) and places switching transistor $T_5$ in the saturated condition to connect input terminal 24 to node A. The node A voltage (FIG. 3f) becomes equal to the negative magnitude $-V_X$ of the input voltage to be measured. The voltage across large storage wall capacitance $C_S$ does not instantaneously change, whereby, when node A voltage decreases by a magnitude $V_X$, the node B voltage also decreases, by a slightly smaller amount $V_X'$, to a magnitude $(V_{TH}-V_X')$. The negative-going change $V_X'$ in the node B voltage is somewhat less than the negative-going change in the node A voltage due to voltage division in the series circuit formed by large storage wall capacitance $C_S$ and parasitic depletion-substrate capacitance $C_3$; as large storage well capacitance $C_S$ is advantageously several orders of magnitude greater than the parasitic capacitance $C_3$, the magnitude of the change in the node B voltage ($V_X'$) approaches, but is still somewhat less than, the change in the node A voltage upon connection of input terminal 24 thereto.

The control circuits generating waveforms $\phi_3$ and $\phi_4$ are synchronized with the falling edge of waveform $\phi_1$ (FIG. 3a). Thus, at time $t_8$, a potential difference substantially equal to the unknown voltage to be measured is applied across large storage wall capacitance $C_S$. A metered amount of charge is now repeatedly transferred from circuit 22 to large storage wall capacitance $C_S$ until the large storage wall is recharged to the voltage $V_{TH}$ initially placed across capacitance $C_S$ immediately prior to commencement of the measurement. When this threshold voltage level is traversed, the output 27c of threshold comparator 27 changes amplitude, signifying the end of conversion. The number of metered packets of charge supplied to large storage wall capacitance $C_S$ is proportional to the magnitude of the unknown input voltage.

The metered packets of charge are provided to node B by charge-packet-transfer circuit 22 in the following manner: at time $t_8$, both the $\phi_1$ and $\phi_1'$ waveforms fall to their negative values. The $\phi_1$ waveform causes transistors $T_1$ and $T_4$ to saturate, connecting nodes C and D respectively to the essentially constant charging voltage of magnitude $-V_{DD}$ and the essentially constant scaling voltage of magnitude $-V_S$. Simultaneously, waveform $\phi_1'$ turns on transistor $T_8$ to act as a resistance across small potential wall capacitance $C_X$. The source-drain resistance of transistor $T_8$ acts to discharge capacitance $C_X$ during the time interval $t_8$-$t_9$, such that the voltage at node C (FIG. 3h) changes to a magnitude $(-V_y)$ which is less than the magnitude $(-V_S)$ of the scaling voltage and greater than the cutoff voltage of transistor $T_1$, where the $T_1$ cutoff voltage is equal to the applied gate voltage $\phi_1$ minus the threshold voltage $V_{T1}$ of the device, e.g. V cutoff, $T_1 = -(\phi_1 - V_{T1})$.

The $\phi_1$ voltage stays negative during the time interval $t_8$-$t_{10}$, and the $\phi_1'$ voltage stays negative for a shorter time interval ($t_8$-$t_9$). Thus, at time $t_9$, the $\phi_1'$ waveform returns to zero volts, rendering discharge transistor $T_8$ in the cutoff condition, while the $\phi_1$ voltage is still at its negative value, whereby capacitance $C_X$ is charged, through transistor $T_1$, along a charging curve 30 (of FIG. 3h) such that the voltage at node C approaches, and becomes equal to, the cutoff voltage of transistor $T_1$, which voltage is equal to $-(\phi_1 - V_{T1})$.

At time $t_{10}$, the $\phi_1$ voltage returns to the zero volt level to place transistors $T_1$ and $T_4$ in the cutoff condition. The $\phi_2$ voltage falls to its negative-most level and transistors $T_{2a}$ and $T_3$ are driven into saturation. Node D is connected to electrical ground, whereby the node D voltage (FIG. 3i) rises from the previous scaling voltage value of $-V_S$ volts to zero volts. The node C voltage follows the node D voltage change and has a similar rise of $V_S$ volts, to a value of $(-\phi_1 - V_{T1}) + V_S$ volts. Thus, the change at node C, when transistor $T_3$ saturates, is of magnitude equal to the magnitude of scale voltage $V_S$. Transistor $T_{2a}$ is also turned on and charge flows from capacitor $C_X$, through transistor $T_2$ (e.g. through transistors $T_{2a}$ and $T_{2b}$) until the $T_{2a}$ portion of transistor $T_2$ is cut off, i.e. the voltage at source thereof (node C) reaches a voltage of $-(\phi_2 - V_{T2})$, where $V_{T2}$ is the threshold voltage of transistor $T_2$. The amount of charge transferred from capacitor $C_X$ into large storage wall capacitor $C_S$ is equal to the capacitance of capacitor $C_X$ times the change in voltage thereacross. The change in charge $\delta Q$ is equal to $C_X$ times the difference between the starting voltage (the voltage on node C at time $t_{10}$) and the final voltage (the voltage on node C at time $t_{12}$). Accordingly $$\delta q = C_X(-\phi_1 + V_{T1} + V_S + \phi_2 - V_{T2}) \quad (1)$$

Advantageously, ADC 20 is implemented in monolithic fashion whereby the "ideal transistor" comprised of devices $T_{2a}$ and $T_{2b}$ is a single transistor $T_2$, commonly known as a "shelf" transistor, having a gate electrode at potential $\phi_2$, and whereby both transistors $T_1$ and $T_2$ are formed in the same semiconductor substrate at the same time with the same process steps. Thus, the threshold voltages $V_{T1}$ and $V_{T2}$ of transistors $T_1$ and $T_2$ can be made equal. Similarly, the waveform-generating control circuitry may be fabricated on a single semiconductor substrate, which may be the same substrate upon which the ADC and circuit 20 are fabricated, whereby the magnitudes of waveforms $\phi_1$ and $\phi_2$ are identical. Then, equation (1) becomes $\delta q = C_X V_S$, and each charge-transfer cycle changes the amount of charge in large storage wall capacitance $C_S$ by an amount established only by the magnitude of capacitance $C_X$ and scale voltage $V_S$. Further, as node C then starts and ends each charge transfer subcycle (in the time intervals when waveform $\phi_2$ is negative) at a voltage which is equal to a phase voltage minus a threshold voltage, any parasitic capacitance $C_P$ from node C to substrate ground will undergo no net change in charge and will therefore not contribute charge for transfer to the large storage wall capacitance $C_S$. Thus, the charge transfer mechanism is made independent of all processing parameters except the magnitude of capacitance $C_X$.

After the first charge transfer cycle, in time interval $t_8$-$t_{12}$, the node B voltage rises from the initial node B voltage of $V_{TH} - V_X$ to a value $V_1$ which is greater than $(V_{TH} - V_X')$ but less than the threshold voltage $V_{TH}$ of comparator 27. Additional charge transfer cycles occur until the node B voltage reaches the threshold voltage of the comparator. Thus, in the illustrated example, additional cycles 2-5 occur, during respective time intervals $t_{12}$-$t_{16}$, $t_{16}$-$t_{20}$, $t_{20}$-$t_{24}$ and $t_{24}$-$t_{28}$. At the initiation of each cycle, e.g. at $t_{12}$, $t_{16}$, $t_{20}$ and $t_{24}$, respectively, the $\phi_1$ and $\phi_1'$ waveforms attain their negative values, discharging node C to a voltage of magnitude $V_y$. Shortly thereafter, e.g. at times $t_{13}$, $t_{17}$, $t_{21}$ and $t_{25}$, respectively, the $\phi_1'$ voltage returns to zero while the $\phi_1$ voltage remains at its negative value and node C is charged to a voltage of magnitude $-(\phi_1 - V_{T1})$. Thereafter, at times $t_{14}$, $t_{18}$, $t_{22}$ and $t_{26}$, respectively, the $\phi_1$ voltage returns to a zero level and the $\phi_2$ voltage falls to its negative value, ground node D and turning on transistor $T_2$ to cause charge transfer between capacitance $C_x$ and capacitance $C_S$. In the latter half of each cycle ($t_{14}$-$t_{16}$, $t_{18}$-$t_{20}$, $t_{22}$-$t_{24}$ and $t_{26}$-$t_{28}$, respectively) the voltage at node B rises, e.g. to successively greater levels $V_2$, $V_3$, $V_4$ and $V_5$ respectively, until the node B voltage exceeds the threshold voltage $V_{TH}$ of the comparator and the comparator output changes level, signaling the control circuit to return the $\phi_3$ and $\phi_4$ waveforms to their negative values, which respectively connects the comparator output to node B preparatory to the start of a next successive measurement, and connects node A to input 25, removing the unknown voltage at input 24 from node A. A counter in the control circuits has kept track of the number N of negative-going $\phi_2$ excursions occurring between the commencement of the first charge-transfer cycle (starting at $t_8$ in the illustrated example) and the time when the node B voltage reaches the threshold voltage of the comparator. The number N of charge transfers to the large storage wall capacitance is given by $$N = (C_S V_X)/(C_X V_S).$$

Thus, the magnitude of the input voltage $V_X$ is given by $$V_X = (N C_X V_S)/C_S$$

Thus, the input voltage is proportional to the number of charge-transfer cycles, to the ratio of the small MOS capacitor $C_X$ to the large MOS capacitor $C_S$, and to the applied scaling voltage $V_S$ and is essentially independent of all other circuit parameters.

The present invention has been described with respect to one presently preferred embodiment thereof. Many variations and modifications will now occur to those skilled in the art. It is our intent, therefore, to be limited only by the scope of the appending claims and not by the specific preferred embodiment described herein.

What is claimed is:

1. In an analog-to-digital converter of the type wherein an analog signal is converted to a digital signal by the transfer of a plurality of charge packets into and out of a two-terminal capacitive means for storaging charge, and having a comparator providing an output signal indicative of the voltage at the charge storing means reaching a predetermined threshold potential, the improvement comprising:

first means for connecting a first one of a pair of differential input potentials to be measured to a first terminal of said charge storing means prior to commencement of a measurement;

second means for connecting the remaining one of said pair of differential input potentials to be measured to said first terminal of said charge storage means at commencement of, and during, a measurement;

means coupled to a second terminal of said charge storing means for establishing a potential thereat, prior to commencement of a measurement, equal to said predetermined threshold potential;

charge packet generating means including means for providing a scaling potential of known magnitude;

another capacitive means for storing charge, and having first and second terminals;

means for alternatively connecting said first terminal of said another charge storing means to said scaling potential and to electrical ground potential;

a source of charging potential;

means for connecting the second terminal of said another charge storing means to said charging potential source when said first terminal is connected to said scaling voltage providing means;

means for discharging said another charge storing means during an initial portion, but less than all, of the time interval during which said another charge storing means is connected to said charging and scaling potentials; and third means for connecting the second terminal of said another charge storing means to said charge storing means when the first terminal of said another charge storing means is connected to said electrical ground potential; said another charge storing means supplying a charge packet to said charge storing means of magnitude determined essentially only by the magnitude of said scaling potential and the ratio of the electrical capacitances of said another charge storing means to said charge storing means.

2. The converter as set forth in claim 1, wherein the electrical capacitance of said charge storing means is greater than the electrical capacitance of said another charge storing means.

3. The converter as set forth in claim 1, wherein a parasitic electrical capacitance is present between said second terminal of said charge storing means and electrical ground potential, the magnitude of said parasitic capacitance being at least one order of magnitude less than the magnitude of the electrical capacitance of said charge storing means.

4. The converter as set forth in claim 2, wherein another parasitic electrical capacitance is present between said second terminal of said another charge storing means and electrical ground potential.

5. The converter as set forth in claim 1, wherein said first and second means each comprise one of a pair of switching transistors each having a drain-source circuit coupled between the first terminal of said charge storing means and the respective first and remaining ones of said pair of differential input potentials; and further including means for alternatingly driving said switching transistors from cut-off into saturation.

6. The converter as set forth in claim 1, wherein said comparator has first and second inputs respectively coupled to the second terminal of said charge storing means and to said predetermined threshold potential, and an output; said potential establishing means comprising a semiconductor device connected to said first input and said output of said comparator for providing a low resistance path therebetween prior to commencement, and after completion, of a measurement.

7. The converter as set forth in claim 1, wherein said converter is fabricated as a monolithic integrated circuit.

8. The converter as set forth in claim 7, wherein said charge storing means is a potential well fabricated in said monolithic integrated circuit.

9. The converter as set forth in claim 8, wherein said another charge storing means is another potential well fabricated in said monolithic integrated circuit.

10. The converter as set forth in claim 1, wherein said alternatively connecting means comprises a semiconductor device connected between said first terminal of said another charge storing means and said scaling potential providing means and providing a low resistance path therebetween during a first portion of a plurality of charge transfer cycles in said converter; and another semiconductor device providing a low resistance path between said another charge storing means first terminal and electrical ground potential, during a second portion of said plurality of conversion cycles, said second portion of each conversion cycle occuring during a time mutually exclusive from the time interval of the first portion of each conversion cycle.

11. The converter as set forth in claim 10, wherein said second terminal connecting means is a semiconductor device providing a low resistance path between said source of charging potential and said second terminal of said another charge storing means during said first portion of each of said plurality of conversion cycles.

12. The converter as set forth in claim 10, wherein said discharging means is a semiconductor device providing a low resistance path between the first and second terminals of said another charge storing means during an initial part, but less than the entire duration, of said first portion of said plurality of conversion cycles.

13. The converter as set forth in claim 1, wherein said third means is a "shelf" transistor.

14. The converter as set forth in claim 1, wherein said first, second, potential establishing, alternatively connecting, second terminal connecting, discharging and third means are all MOS transistors.

15. The converter as set forth in claim 14, wherein said MOS transistors are of the PMOS type.

16. The converter as set forth in claim 14, wherein all of said MOS transistors, and said charge storing means and said another charge storing means are fabricated in a monolithic member of semiconductor material.

* * * * *